(12) United States Patent
Fackelmeier et al.

(10) Patent No.: US 10,094,894 B2
(45) Date of Patent: Oct. 9, 2018

(54) TRANSMITTING AND/OR RECEIVING MRI SIGNALS FOR A MRI EXAMINATION

(71) Applicants: Andreas Fackelmeier, Thalmässing (DE); Sebastian Martius, Forchheim (DE); Robert Rehner, Neunkirchen am Brand (DE); Christopher Stumpf, Erlangen (DE); Markus Vester, Nürnberg (DE)

(72) Inventors: Andreas Fackelmeier, Thalmässing (DE); Sebastian Martius, Forchheim (DE); Robert Rehner, Neunkirchen am Brand (DE); Christopher Stumpf, Erlangen (DE); Markus Vester, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 760 days.

(21) Appl. No.: 14/632,154

(22) Filed: Feb. 26, 2015

(65) Prior Publication Data

US 2015/0241528 A1     Aug. 27, 2015

(30) Foreign Application Priority Data

Feb. 27, 2014   (DE) .................. 10 2014 203 588

(51) Int. Cl.
    *G01R 33/36*    (2006.01)
    *G01R 33/34*    (2006.01)
(52) U.S. Cl.
    CPC ... *G01R 33/3657* (2013.01); *G01R 33/34023* (2013.01)
(58) Field of Classification Search
    USPC .......................... 324/300–322; 600/407–435; 382/128–131
    See application file for complete search history.

(56) References Cited

U.S. PATENT DOCUMENTS 5,258,710 A    11/1993  Black et al.
7,656,258 B1 *  2/2010  Antaya .................... H01F 6/00
                                                      313/62

(Continued)

FOREIGN PATENT DOCUMENTS

DE     102008063460 B4    12/2011

OTHER PUBLICATIONS

German Search Report cited in DE 10 2014 203 588.0, dated Oct. 28, 2014, with English translation.

(Continued)

*Primary Examiner* — Melissa Koval
*Assistant Examiner* — Tiffany Fetzner
(74) *Attorney, Agent, or Firm* — Lempia Summerfield Katz LLC

(57) ABSTRACT

An arrangement includes a superconducting split ring resonator, a cryostat, and a copper coil. The resonator is arranged in the cryostat and includes at least one ring-shaped conductor made of a superconducting material and including an opening and a taper. The copper coil may be used to transmit a MRI excitation signal. This signal causes a current to be induced in the conductor that leads to the breakdown of the superconductivity. The conductor is detuned and therefore no longer develops an interfering effect. It is possible for the effect of the breakdown of superconductivity to be used for detuning in a targeted manner. After the transmission is complete, the conductor returns into the superconducting state and acts as a superconducting reception antenna for the MRI measurement signal. The copper coil is inductively coupled to the conductor and configured to read out the signal induced in the conductor.

20 Claims, 3 Drawing Sheets

(56) References Cited

U.S. PATENT DOCUMENTS

| | | | | |
|---|---|---|---|---|
| 8,106,656 B2* | 1/2012 | Wosik | ............... | G01R 33/34007 |
| | | | | 324/307 |
| 8,384,388 B2 | 2/2013 | Biber | | |
| 8,723,522 B2* | 5/2014 | Ma | ................... | G01R 33/34007 |
| | | | | 324/318 |
| 2003/0052682 A1* | 3/2003 | Withers | ........... | G01R 33/34061 |
| | | | | 324/322 |
| 2004/0032262 A1* | 2/2004 | Withers | ........... | G01R 33/34061 |
| | | | | 324/318 |
| 2007/0216409 A1* | 9/2007 | Overweg | ......... | G01R 33/34046 |
| | | | | 324/262 |
| 2007/0263328 A1* | 11/2007 | Jonas | ................. | G01R 33/3815 |
| | | | | 361/19 |
| 2008/0068014 A1* | 3/2008 | Dannels | ............... | G01R 33/561 |
| | | | | 324/312 |
| 2010/0033185 A1* | 2/2010 | Saha | ................ | G01R 33/34076 |
| | | | | 324/318 |
| 2011/0121830 A1* | 5/2011 | Ma | ................... | G01R 33/34007 |
| | | | | 324/318 |
| 2011/0124507 A1* | 5/2011 | Wosik | ............... | G01R 33/34007 |
| | | | | 505/162 |
| 2015/0241528 A1* | 8/2015 | Fackelmeier | .... | G01R 33/34023 |
| | | | | 324/309 |

OTHER PUBLICATIONS

Black R. D., et al, "Electronics for a High Temperature Superconducting Receiver System for Magnetic Resonance Microimaging," IEEE Transactions on Biomedical Engineering; vol. 41; No. 2; pp. 195-197 (1994).

* cited by examiner

TRANSMITTING AND/OR RECEIVING MRI SIGNALS FOR A MRI EXAMINATION

CROSS-REFERENCE TO RELATED APPLICATIONS

This application claims the benefit of DE 10 2014 203 588.0, filed on Feb. 27, 2014, which is hereby incorporated by reference in its entirety.

TECHNICAL FIELD

The embodiments relate to an arrangement, by which MRI excitation signals may be transmitted and/or MRI measurement signals may be received, and to the corresponding transmission and/or reception method.

BACKGROUND

For imaging in magnetic resonance imaging (MRI), use is made both of comparatively strong, constant main magnetic fields of the order of a few Tesla (T) and of alternating magnetic fields in the millitesla (mT) range for transmitting in the radiofrequency range. The main magnetic field brings about an alignment of the magnetic moments of the nuclei situated in the body to be examined, wherein, in particular, hydrogen nuclei or protons are used for imaging, while the alternating magnetic fields are used as transmission signals or excitation pulses for deflecting or exciting the magnetic moments from such a rest position. This results in a precession movement of the nuclei or the magnetic moments, which in turn brings about an induction of an electrical signal in a receiver coil, which may be understood to be a reception signal. This reception signal, to which an appropriate spatial code has been applied, may be used for imaging. The transmission signals and the reception signals are combined under the term MRI signals.

Resonant loop antennas are used for transmitting and receiving corresponding MR signals. During normal operation, these antennas are placed in the direct vicinity of the object to be examined. As a result of this relative proximity of the antenna to the object, the signal-to-noise ratio (SNR) is mainly influenced by the losses due to the presence of the object and less so by the losses in the antenna itself from a certain antenna diameter in the case of magnetic field strengths of 1.5 T or 3 T. By contrast, if the antenna is placed further away from the body, the energy losses of the antenna play an ever greater role in the SNR with increasing distance from the body. Thus, the quality of the antenna increases with distance from the antenna to the object in order to obtain a sufficient SNR.

A corresponding statement applies to low-field systems, for example, with fields of the order of 0.35 T, in the case of antenna elements close to the object and to very small antenna elements in the case of 1.5 T and 3 T systems, as are used, e.g., for skin examinations.

Such a high-quality antenna may be realized with the aid of a self-resonating antenna, for example by using a so-called split ring resonator (SRR). The use of, in particular, superconducting split ring resonators that may be arranged in a cryostat cooled, e.g., by nitrogen, was found to be advantageous. In such a superconducting split ring resonator, conductors forming the antenna include a superconducting material.

If such a superconducting SRR antenna is merely designed as a reception antenna and the body coil of the magnetic resonance scanner is used for transmission in a first scenario, the SRR antenna is detuned during transmission by the body coil in order to avoid that the SRR antenna distorts the B-field generated by the transmitting body coil. For this, use is made of a special circuit in an associated, inductively coupled copper coil that, in the case of transmission by the body coil, causes the SRR antenna to be detuned.

In a second scenario, in which the SRR antenna is designed both as a transmission antenna and as a reception antenna, it is possible, in addition to the above-described detuning, to build up the transmission field by the antenna or to generate the MRI transmission signal. This technical problem, that is to say the production of a superconducting SRR transmission/reception antenna, has not been solved up until now since the superconducting material increasingly loses its superconducting property with increasing current intensity during the transmission state of the antenna, until the losses become too great for it still to be able to be used efficiently as a transmission coil. Additionally, heat is generated in this case, which makes it more difficult to maintain the cooling in the cryostat.

SUMMARY AND DESCRIPTION

The scope of the present invention is defined solely by the appended claims and is not affected to any degree by the statements within this summary. The present embodiments may obviate one or more of the drawbacks or limitations in the related art.

It is an object of the present embodiments to specify an arrangement for transmitting and/or receiving MRI signals that may be used in both of the above-described scenarios. Furthermore, it is an object of the present embodiments to specify a corresponding method.

An arrangement provides, for the first scenario, the arrangement is detunable in the reception state and, additionally for the second scenario, the transmission field may be built up.

What is used conceptually for solving this problem is that a specially embodied split ring resonator is used for the superconducting antenna. This renders it possible that, for the requirements in the first and the second case, the specific current distribution on the split ring resonator may be employed.

The object is achieved by an arrangement for transmitting and/or receiving MRI signals for examining an object, including a superconducting split ring resonator for receiving a MRI measurement signal from the object to be examined. The split ring resonator includes at least a first, substantially ring-shaped, interrupted conductor made of a superconducting material. In terms of interruption, the first conductor includes a first opening and a first taper. Furthermore, the arrangement includes a cryostat for generating predeterminable ambient conditions in a cavity, wherein the split ring resonator is arranged in the cavity and wherein the ambient conditions are predeterminable in such a way that the first conductor may be put into a superconducting state. Moreover, the arrangement includes a conventional coil for transmitting a MRI excitation signal and/or for reading out the MRI measurement signal received by the split ring resonator, wherein the conventional coil is arranged outside of the cryostat and is inductively coupled to the split ring resonator.

It is noted that the term "ring-shaped" also includes elliptical and oval shapes and, in certain embodiments, polygonal shapes.

As already mentioned, the superconductor loses its superconducting effect with increasing current density. Here, the characteristics and the occurrence of this effect are dependent on the width of the conductor. The local tapered locations in the conductor allow the effect of the breakdown of superconductivity to be used in a targeted manner for detuning or switching off the superconducting antenna. This is achieved by virtue of the conductor being tapered locally to the extent that the superconductivity breaks down in a targeted manner above a desired current in the conductor. As a result, the superconducting antenna is detuned and therefore "invisible" to the employed transmission antenna, e.g., to the conventional coil.

As a result, the two aforementioned objects may be achieved since the superconductivity breaks down when a MRI transmission signal is present and the reception antenna in the form of the split ring resonator becomes virtually invisible. At the end of the transmission signal, the superconductivity is once again built up and the split ring resonator receives the MRI measurement signals from the object to be examined.

In the first scenario, e.g., during use as a pure reception antenna, wherein the body coil is used as a transmission antenna, it is possible to dispense with an additional detuning circuit in the inductively coupled copper coil since the antenna or the split ring resonator itself detunes with increasing transmission power and the corresponding breakdown of the superconductivity as a result of the current induced into the superconducting SRR antenna by the transmitting body coil.

In the second scenario, e.g., during use as a transmission/reception antenna, for transmission purposes, use is only made of the copper coil inductively coupled to the superconducting antenna since the superconducting antenna in this case too detunes itself with increasing current as a result of the breakdown in superconductivity. After the transmission pulse is switched off, the superconducting antenna is advantageously available again for reception with the high quality thereof.

Attention is drawn to the fact that, in the case of transmission, it is known that the MRI signals are the excitation pulses or MRI excitation signals that bring about the excitation described in the introduction. The corresponding transmission antenna is represented by the conventional coil. In the case of reception, the MRI signals are the MRI reception signals emitted by the object to be examined and received after excitation with the aid of the reception antenna, as previously described. The reception antenna includes the split ring resonator and the conventional coil, wherein the split ring resonator receives the signals and the conventional coil reads out these signals from the split ring resonator by way of the inductive coupling. Accordingly, the term "MRI signals" includes both the MRI excitation signals and the MRI reception signals.

In one embodiment, the first opening and the first taper are arranged on opposite sides of the first ring-shaped conductor. This symmetrical arrangement provides a particularly advantageous behavior of the split ring resonator in view of being switched off in the case where a transmission field is present, to the extent that quick switching off is made possible.

The split ring resonator includes at least a second, substantially ring-shaped, interrupted conductor made of a superconducting material, wherein the second conductor includes a second opening and a second taper as interruption. An SRR including two or even more conductors with openings and tapers may be built up in such a way that, due to influencing of one another, ideal current/voltage distributions emerge in the conductors. This renders it possible to influence the conditions under which the superconductivity breaks down in a targeted manner.

Like the first conductor, the second opening and the second taper are arranged on opposite sides of the second ring-shaped conductor. As already indicated above, this allows the split ring resonator or the superconductivity of the resonator to be switched off particularly quickly.

The first ring-shaped conductor is oriented substantially parallel to the second ring-shaped conductor and the first conductor and the second conductor are arranged on opposite sides of a substrate of the split ring resonator. As a result of the parallel arrangement, maximum interaction between the individual conductors is achieved.

In particular, the first conductor and the second conductor are oriented in such a way that, in a direction perpendicular to a plane in which the first ring-shaped conductor lies, (1) the first opening of the first conductor lies over the second taper of the second conductor and (2) the first taper of the first conductor lies over the second opening of the second conductor.

This orientation of the two conductors, in which the openings of the conductors respectively lie opposite one another, brings about an ideal current/voltage distribution in the conductors.

The conventional coil is oriented substantially parallel to the first ring-shaped conductor. That is to say, the conventional coil has a winding or a substantially ring-shaped conductor in a plane, with this plane being parallel to the plane in which the first and, optionally, the second ring-shaped conductor(s) lie. The parallel arrangement is advantageous, particularly when the conventional coil reads out a signal from the SRR by way of inductive coupling, since the interaction is maximized in such an arrangement and hence the read-out signal has the maximum amplitude.

The first taper is dimensioned in such a way that superconductivity of the first conductor breaks down when a MRI excitation signal is transmitted. This may be understood to provide that it is irrelevant whether the MRI excitation signal is transmitted by the conventional coil of the arrangement or else by a different transmitter, for example, by the body coil of the MRI. Since the field strengths to be applied are precisely known for each MR scanner and since the conditions under which the superconductivity of a conductor made of a known material and with known dimensions breaks down is likewise known, the assumption may be made that a person skilled in the art may readily calculate how the conductor is to be dimensioned in order to obtain the aforementioned effect.

The second taper is likewise dimensioned in such a way that superconductivity of the second conductor breaks down when a MRI excitation signal is transmitted. This likewise may be understood to provide that it is irrelevant whether the MRI excitation signal is transmitted by the conventional coil or else by, e.g., the body coil of the MRI.

The aforementioned object is furthermore achieved by a method for transmitting a MRI excitation signal and/or for receiving a MRI measurement signal for a MRI examination of an object by a magnetic resonance scanner using the above-described arrangement. Here, the MRI excitation signal is transmitted in a transmission state and/or the MRI measurement signal is received in a reception state. The superconducting split ring resonator is in a non-superconducting state in the transmission state, e.g., the split ring resonator loses its superconductivity with the start of the transmission state. In the reception state, the MRI measurement signal induces a signal in the split ring resonator and the conventional coil reads out the signal induced in the split ring resonator by inductive coupling. Subsequently, the read-out signal is used for image processing and calculation.

During the MRI examination, e.g., in an operating state of the arrangement, the split ring resonator is in a superconducting state during an intermediate state, in which there is neither the transmission of a MRI excitation signal nor the reception of a MRI measurement signal.

In a first embodiment, the conventional coil of the arrangement is used for transmitting the MRI excitation signal. In a second embodiment, a body coil of the magnetic resonance scanner is used for transmitting the MRI excitation signal.

In an advantageous embodiment, a split ring resonator includes two rings with same opening and including a conducting material, which rings lie over one another or are parallel to one another. In this case, for an ideal current/voltage distribution, the openings of the rings, in each case, may lie opposite one another. As a result of this arrangement, the resonator has a voltage maximum at the conductor ends of the opening sites and a current maximum on the opposing side, which current maximum drops off sinusoidally toward the opening ends.

DETAILED DESCRIPTION

Figure 1:
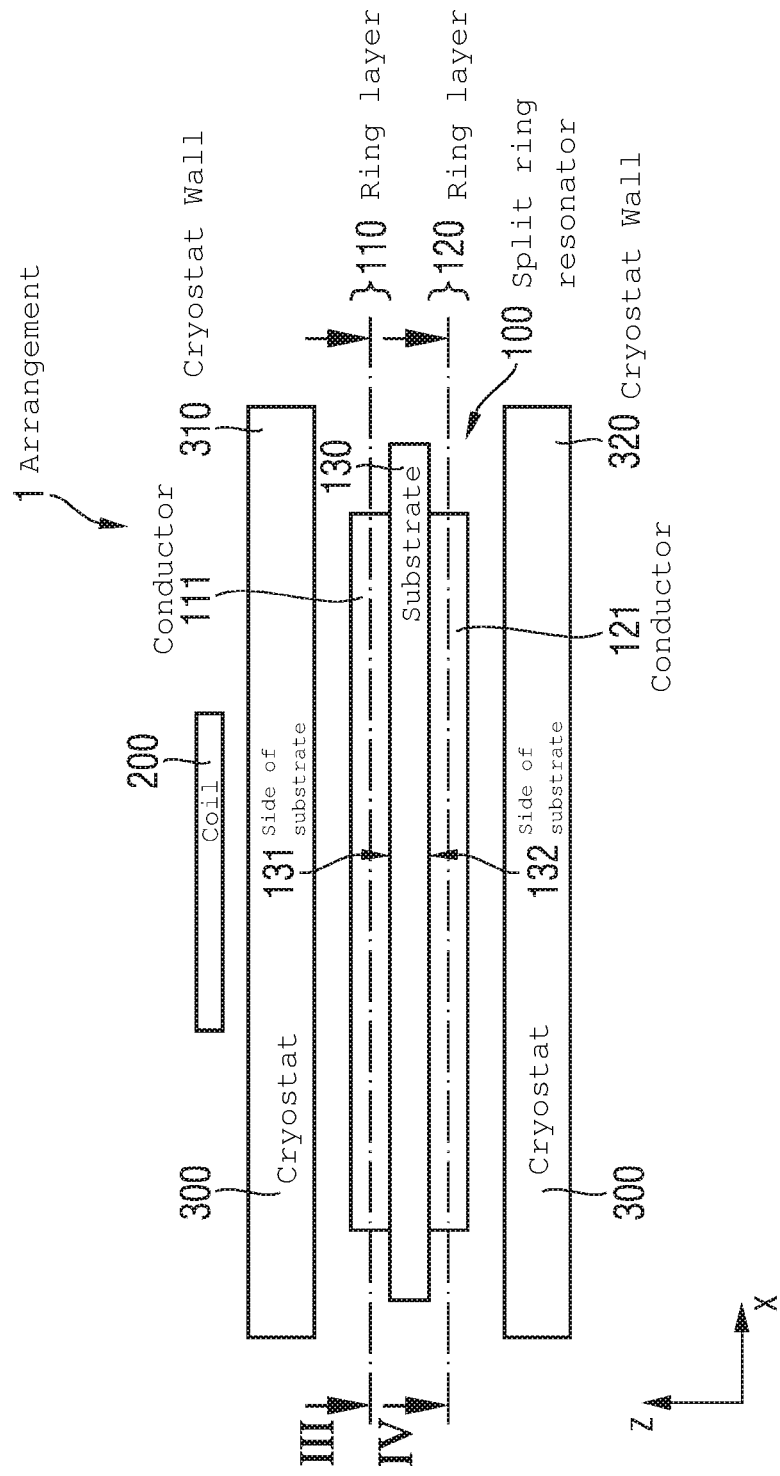
FIG. 1 depicts an embodiment of a lateral cross section through an arrangement.

FIG. 1 depicts a lateral cross-sectional view of an embodiment of an arrangement 1, in particular a coil arrangement 1, including a split ring resonator 100, a conventional coil 200, and a cryostat 300.

Such split ring resonators or resonant circuits may include, e.g., two opened-up metallic conductor elements. The conductor elements are opposite one another, formed as split-open ring structures and conventionally applied parallel to one another on opposite sides of a substrate. The conductor elements simultaneously act as capacitive elements and as inductive elements. The split ring resonators are supplied with energy by radiofrequency (RF) wave radiation, as a result of which they are excited to oscillate resonantly.

The split ring resonator 100 depicted in FIG. 1 includes a first split ring layer 110, a second split ring layer 120, and a substrate 130, wherein each one of the split ring layers 110 and 120 includes a ring-shaped electrical conductor 111 and 121. The conductors 111, 121 are ring-shaped and arranged parallel to one another on opposite sides 131, 132 of the substrate 130. By way of example, the substrate 130 may be a sapphire substrate. The electrical conductors 111, 121 include a superconducting material, e.g., yttrium barium copper oxide (YBCO). As such, the electrical conductors may be put into a superconducting state in the case of appropriate ambient and operating conditions of the arrangement 1. Here, the ambient conditions, in particular, the temperature of the conductors, depend, inter alia, on the operating conditions of the coil arrangement 1, in particular, on the currents flowing in the conductors 111, 121, since the conductors 111, 121 leave the superconducting state with increasing current density.

In order to generate suitable ambient conditions, the split ring resonator 100 is arranged in the cryostat 300. The cryostat 300, of which merely an upper and a lower cryostat wall 310, 320 are indicated in FIG. 1, renders it possible to set the ambient temperature of the split ring resonator 100 in such a way that the electrical conductors 111, 121 may be put into the superconducting state. For the purposes of generating correspondingly low temperatures, the cryostat may, for example, be filled with liquid nitrogen.

The conventional coil 200, (e.g., a copper coil), is arranged outside of the cryostat 300 and oriented in such a way that it lies parallel to the conductors 111, 121 of the split ring resonator 100. The copper coil 200 is coupled inductively to the split ring resonator 100.

As explained in more detail below, the function of the split ring resonator 100 lies in receiving MR signals from the object to be examined. Accordingly, the split ring resonator 100 assumes the function of a reception antenna. Depending on the case of application, the conventional coil 300 or the copper coil 300 has the object of generating the transmission pulses in a transmission mode and/or inductively reading out the received MR signals from the split ring resonator 100 with the aid of the latter in a reception mode.

Figure 2:
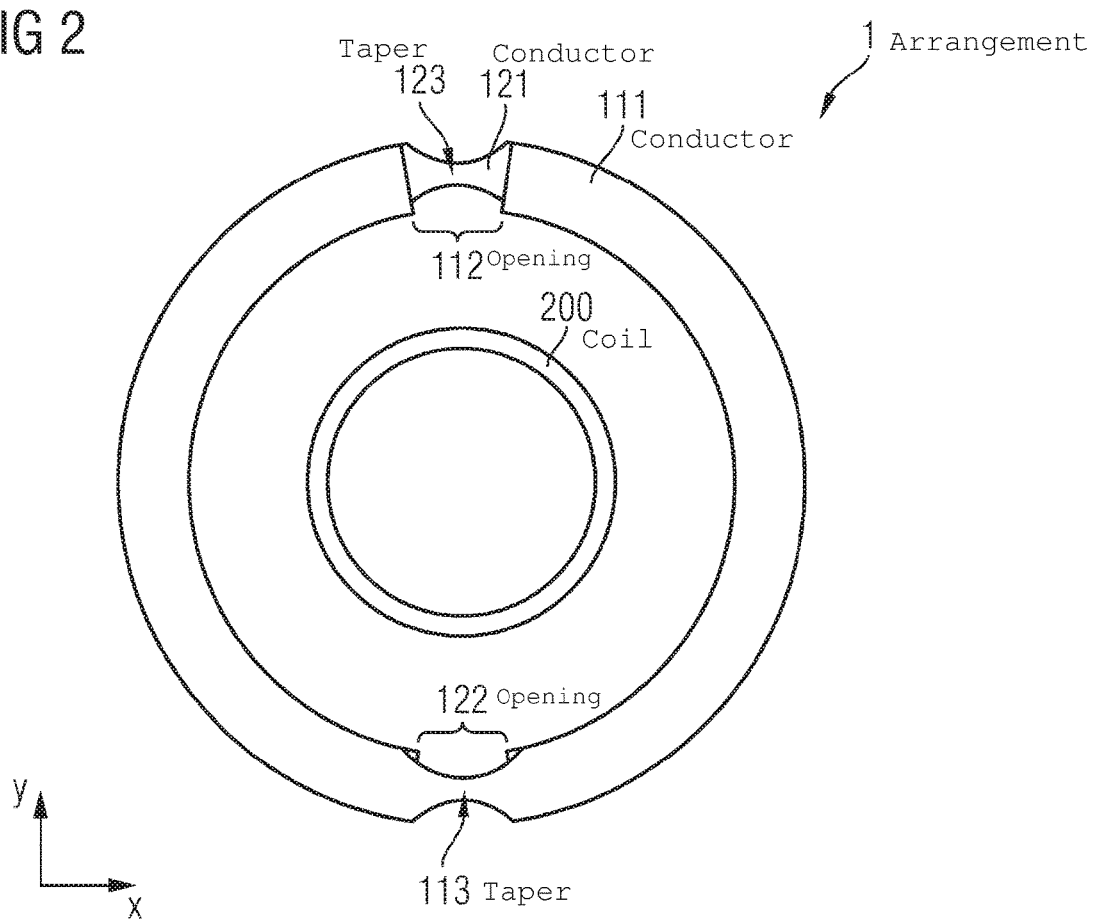
FIG. 2 depicts an embodiment of a plan view of the arrangement.

FIG. 2 depicts a plan view of the coil arrangement 1, wherein the cryostat walls 310, 320, depicted in FIG. 1, are not depicted in FIG. 2. The copper coil 200 and the conductor 111 of the first split ring layer 110 and the conductor 121 of the second split ring layer 120 are arranged concentrically.

The conductors 111 and 121 respectively include an opening 112 or 122 and a taper 113 or 123, wherein the openings 112, 122 constitute interruptions in the corresponding conductors 111, 121. By way of example, the tapers 113, 123 may be formed concavely. The conductors 111, 121 are arranged in relation to one another in such a way that the opening 112 of the conductor 111 of the first layer 110 lies over the taper 123 of the conductor 121 of the second layer 120. Conversely, the opening 122 of the conductor 121 of the second layer 120 lies under the taper 113 of the conductor 111 of the first layer 110.

As a result of this arrangement, the split ring resonator 110 has a voltage maximum at the openings 112, 122 at the ends of the conductors 111, 121 and has a current maximum on the opposite side of the respective conductor 111, 121, arranged at the respective taper 113, 123, which current maximum drops off sinusoidally to the openings 112, 122.

This orientation of the conductors 111, 121, in which the openings of the conductors 111, 121 respectively lie opposite to one another, brings about an ideal current/voltage distribution in the conductors 111, 121 since the position at which the conductor 111 or 121 of the one layer 110 or 120 has an opening 112 or 122 and therefore a voltage maximum, the respectively other conductor 121 or 111 has a taper 123 or 113 on the opposite side and therefore a current maximum.

Figure 3:
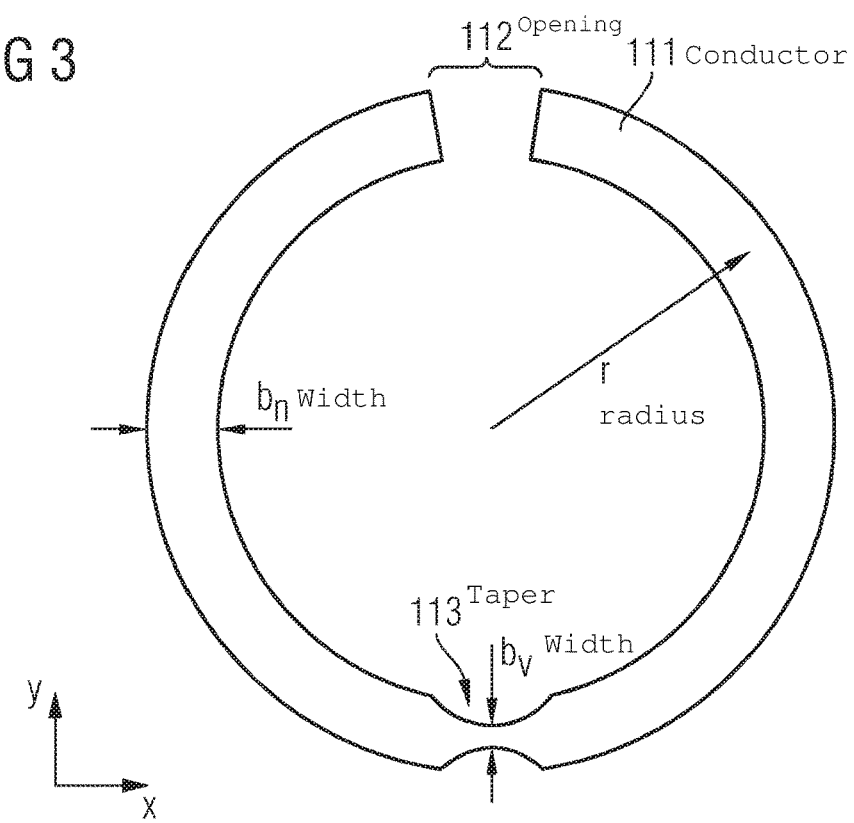
FIG. 3 depicts an embodiment of a plan view of the first conductor of the first layer of the split ring resonator.
Figure 4:
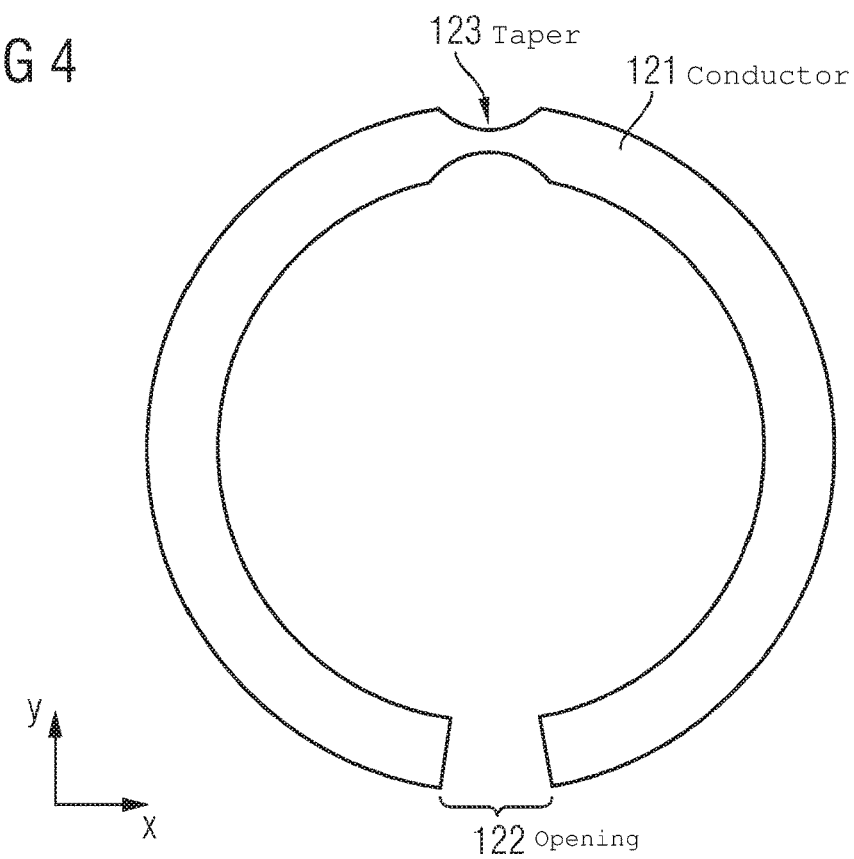
FIG. 4 depicts an embodiment of a plan view of the second conductor of the second layer of the split ring resonator.

FIG. 3 depicts the cross section denoted by III in FIG. 1, e.g., a plan view of the first split ring layer 110 and the conductor 111 with the opening 112 and the taper 113. FIG. 4 depicts the cross section denoted by IV in FIG. 1, e.g., a plan view of the second split ring layer 120 and the conductor 121 with the opening 122 and the taper 123. The above-described opposite orientation of the first and the second split ring layers 110, 120 and, in particular, the orientations of the conductors 111, 121 of the split ring layers 110, 120 becomes clear from FIGS. 3 and 4. In particular, it is possible to identify that the opening 112 of the conductor 111 of the first split ring layer 110 is positioned over the taper 123 of the conductor 121 of the second split ring layer 120 and that the taper 113 of the conductor 111 of the first split ring layer 110 is positioned over the opening 122 of the conductor 121 of the second split ring layer 120.

As depicted in FIG. 3, the width $b_v$ of the conductor 111 in the region of the taper 112 is less than the width $b_n$ of the conductor 111 in the non-tapered, e.g., normal, region of the conductor 111. By way of example, for a main magnetic field of 3 T, the conductor 111 may be dimensioned in such a way that it has a conductor width of $b_n$=3 mm in the normal region and a width of $b_v$=1 mm in the region of the taper 112. Here, the radius r of the conductor 111 may be of the order of r=40 mm The same applies to the conductor 121 of the second layer 120 depicted in FIG. 4.

A split ring resonator 100 with only one layer, e.g., with the first layer 110, and accordingly with only one conductor also suffices to provide the above-described functionality of the coil arrangement 1. Compared to a single layer split ring resonator, a split ring resonator 100 with more than one layer is advantageous in that it reacts less sensitively to changes in the surroundings since the capacitance of the resonant circuit in the single layer case is formed by an external E-field. For a two-layer or multi-layer split ring resonator 100, the capacitance is formed by the overlaps of the individual layers, and so the dependence on external influences is smaller. In the case where the split ring resonator 100 includes more than two layers 111, 121 (and therefore also includes more than two conductors 110, 120, not explicitly depicted here), the conductors may be arranged in such a way that what applies to two conductors arranged next to one another is that the opening of the one conductor of the two conductors lies over the taper of the other conductor of the two conductors.

In the following, the functionality of the described coil arrangement 1 is explained. The conductors 111, 121 of the split ring resonator 100 act as capacitive elements and, simultaneously, also as inductive elements. The split ring resonator 100 is supplied with energy by radiofrequency wave radiation, as a result of which it is excited to oscillate resonantly.

During transmission with the aid of the body coil of the magnetic resonance scanner, there automatically is detuning of the split ring resonator 100 and a change in the resonant frequency thereof since the split ring resonator 100 detunes itself with increasing transmission power, and with the increase in temperature and the corresponding breakdown of superconductivity connected therewith, as a result of the current induced into the superconducting conductor 111, 121 by the transmitting body coil.

During transmission with the aid of the conventional coil or copper coil 300 of the coil arrangement 1, there likewise is a breakdown in superconductivity in a similar fashion as a result of the current induced into the conductors 111, 121 of the split ring resonator 100 here.

As a result of the desired detuning occurring in these two scenarios, the split ring resonator 100 does not constitute an interfering factor, either during transmission with the body coil or during transmission with the conventional coil or copper coil 300. After switching off the respective transmission pulse, the superconducting antenna in the form of the split ring resonator 100 is advantageously available again for reception with the high quality thereof.

Accordingly, the coil arrangement 1 does not require a separate detuning circuit since, as a result of the auto-detuning split ring resonator 100, the otherwise interfering effect of the resonator during transmission is canceled automatically as a result of the breakdown in superconductivity.

If the coil arrangement 1 is used for reception, the MR signals are received by the superconducting split ring resonator 100 and inductively read out, and fed to the further signal processing, outside of the cryostat 200 with the aid of the copper coil 300. Here, the term "read out" provides that the signal induced in the split ring resonator 100 in turn causes a corresponding secondary signal to be induced in the copper coil 200. This secondary signal is finally used for imaging.

Other constellations are also feasible in addition to the above-described embodiments. By way of example, a modified positioning of the taper 113, 123 may influence whether the split ring resonator 100 may be switched off more quickly or more slowly. Furthermore, the dimensioning of the tapers 113, 123, for example, the conductor width at the location of the tapers 113, 123, may set the field strength at which the superconductivity of the conductors 111, 121 is intended to break down. By way of example, the superconductivity would break down earlier in the case of a narrower taper 113, 123, e.g., in the case of a lower width $b_v$ of the conductor 111, 121 in the region of the taper 113, 123, as a result of the correspondingly higher current density in this region.

For the sake of completeness, reference is made to the fact that the term "parallel" in conjunction with the aforementioned coils and/or conductors, etc., may be understood to provide that the spatial planes in which the relevant coils or conductors lie are oriented parallel to one another. Furthermore, the terms "over" and "under" relate to the direction perpendicular to the planes in which the conductors 111, 121 lie; that is to say, in the coordinate system depicted in FIG. 1, the term "over" relates to the positive z-direction, which is parallel to the normal of the plane in which, e.g., the conductor 111 lies.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance imaging (MRI) arrangement configured for transmitting, receiving, or transmitting and receiving MRI signals that are utilized in examining an object, the MRI arrangement comprising:
   a superconducting split ring resonator configured to receive a MRI measurement signal from the object being examined, the superconducting split ring resonator comprising at least a first ring-shaped interrupted conductor made of a superconducting material, wherein the first ring-shaped interrupted conductor comprises a first opening and a first taper;

a cryostat configured to generate predeterminable ambient conditions in a cavity of the MRI arrangement, wherein the superconducting split ring resonator is arranged in the cavity and wherein the generated predeterminable ambient conditions are configured to place the first ring-shaped interrupted conductor into a superconducting state, and a conventional coil that is configured to transmit an MRI excitation signal and also read out the MRI measurement signal that is received by the superconducting split ring resonator, wherein the conventional coil is located outside of the cryostat and wherein the conventional coil is inductively coupled to the superconducting split ring resonator.

2. The MRI arrangement as claimed in claim 1, wherein the first opening and the first taper are arranged on opposite sides of the first ring-shaped interrupted conductor.

3. The MRI arrangement as claimed in claim 1, wherein the superconducting split ring resonator comprises:
at least a second ring-shaped interrupted conductor made of a superconducting material, and
wherein the second ring-shaped interrupted conductor comprises:
a second opening and a second taper.

4. The MRI arrangement as claimed in claim 3, wherein the second opening and the second taper are arranged on opposite sides of the second ring-shaped interrupted conductor.

5. The MRI arrangement as claimed in claim 4, wherein the first ring-shaped interrupted conductor is oriented parallel to the second ring-shaped interrupted conductor.

6. The MRI arrangement as claimed in claim 5, wherein the first ring-shaped interrupted conductor and the second ring-shaped interrupted conductor are arranged on opposite sides of a substrate that is part of the superconducting split ring resonator.

7. The MRI arrangement as claimed in claim 6, wherein the first ring-shaped interrupted conductor and the second ring-shaped interrupted conductor are oriented in a direction that is perpendicular to a plane in which the first ring-shaped interrupted conductor lies, whereby the first opening of the first ring-shaped interrupted conductor lies over the second taper of the second ring-shaped interrupted conductor and the first taper of the first ring-shaped interrupted conductor lies over the second opening of the second ring-shaped interrupted conductor.

8. The MRI arrangement as claimed in claim 7, wherein the conventional coil is oriented in a direction that is parallel to the first ring-shaped interrupted conductor.

9. The MRI arrangement as claimed in claim 8, wherein dimensions of the first taper cause the superconductivity of the first ring-shaped interrupted conductor to break down when the MRI excitation signal is transmitted.

10. The MRI arrangement as claimed in claim 1, wherein dimensions of the first taper cause the superconductivity of the first ring-shaped interrupted conductor to break down when the MRI excitation signal is transmitted, and
wherein a ratio between a width $b_v$ of the first ring-shaped interrupted conductor in a region of the first taper and a width $b_n$ of the first ring-shaped interrupted conductor that is located away from the region of the first taper and also located away from a separate region of the first opening is $b_v:b_n=1:3$.

11. The MRI arrangement as claimed in claim 3, wherein the first ring-shaped interrupted conductor is oriented a direction that is parallel to the second ring-shaped interrupted conductor.

12. The MRI arrangement as claimed in claim 3, wherein the first ring-shaped interrupted conductor and the second ring-shaped interrupted conductor are arranged on opposite sides of a substrate that is part of the superconducting split ring resonator.

13. The MRI arrangement as claimed in claim 3, wherein the first ring-shaped interrupted conductor and the second ring-shaped interrupted conductor are oriented in a direction that is perpendicular to a plane in which the first ring-shaped interrupted conductor lies, whereby the first opening of the first ring-shaped interrupted conductor lies over the second taper of the second ring-shaped interrupted conductor and the first taper of the first ring-shaped interrupted conductor lies over the second opening of the second ring-shaped interrupted conductor.

14. The MRI arrangement as claimed in claim 3, wherein the conventional coil is oriented in a direction that is parallel to the first ring-shaped interrupted conductor.

15. The MRI arrangement as claimed in claim 3, wherein the dimensions of the first taper cause the superconductivity of the first ring-shaped interrupted conductor to break down when the MRI excitation signal is transmitted.

16. A magnetic resonance imaging (MRI) method configured for transmitting, receiving, or transmitting and receiving MRI excitation signals that are utilized in a MRI examination of an object by a magnetic resonance scanner using an MRI arrangement comprising a superconducting split ring resonator, a cryostat, and a conventional coil, the MRI method comprising:
receiving a MRI measurement signal in a reception state from the object that is being examined by utilizing the superconducting split ring resonator;
generating predeterminable ambient conditions in a cavity of the MRI arrangement, wherein the superconducting split ring resonator is located in the cavity; and
transmitting a MRI excitation signal in a transmission state, reading out the MRI measurement signal received by the superconducting split ring resonator, or both transmitting the MRI excitation signal and reading out the MRI measurement signal received by the superconducting split ring resonator, wherein the conventional coil is located outside of the cryostat and wherein the conventional coil is inductively coupled to the superconducting split ring resonator,
wherein the superconducting split ring resonator is in a non-superconducting state when the superconducting split ring resonator is in the transmission state, and
wherein the MRI measurement signal induces a signal in the superconducting split ring resonator, when the superconducting split ring resonator is in the reception state, and
wherein the inductively coupled conventional coil is utilized in order to read out the signal induced in the superconducting split ring resonator by the inductive coupling.

17. The method as claimed in claim 16, wherein, during the MRI examination, the superconducting split ring resonator is placed into a superconducting state, wherein there is neither the transmission of the MRI excitation signal nor the reception of the MRI measurement signal, occurring within the MRI examination in the superconducting state.

18. The method as claimed in claim 16, wherein the conventional coil is used in transmitting the MRI excitation signal.

19. The method as claimed in claim 16, wherein a body coil of the magnetic resonance scanner is used in transmitting the MRI excitation signal.

20. A magnetic resonance scanner comprising:
a magnetic resonance imaging (MRI) arrangement configured for transmitting, receiving, or transmitting and receiving MRI signals that are utilized in examining an object, the MRI arrangement comprising:
   a superconducting split ring resonator configured to receive a MRI measurement signal from the object being examined, the superconducting split ring resonator comprising at least a first ring-shaped interrupted conductor made of a superconducting material, wherein the first ring-shaped interrupted conductor comprises a first opening and a first taper;
   a cryostat configured to generate predeterminable ambient conditions in a cavity of the MRI arrangement, wherein the superconducting split ring resonator is arranged in the cavity and wherein the generated predeterminable ambient conditions place the first ring-shaped interrupted conductor into a superconducting state, and
   a conventional coil that is configured to transmit an MRI excitation signal and also read out the MRI measurement signal that is received by the superconducting split ring resonator, wherein the conventional coil is located outside of the cryostat and wherein the conventional coil is inductively coupled to the superconducting split ring resonator.

* * * * *